United States Patent
Pfeiffer

(10) Patent No.: US 9,915,002 B2
(45) Date of Patent: Mar. 13, 2018

(54) SYSTEM AND METHOD FOR PRODUCING A NANO METAL MESH USING A BRITTLE FILM TEMPLATE FOR LITHOGRAPHY

(71) Applicant: Ethan Pfeiffer, New Braunfels, TX (US)

(72) Inventor: Ethan Pfeiffer, New Braunfels, TX (US)

( * ) Notice: Subject to any disclaimer, the term of this patent is extended or adjusted under 35 U.S.C. 154(b) by 345 days.

(21) Appl. No.: 14/860,582

(22) Filed: Sep. 21, 2015

(65) Prior Publication Data

US 2017/0081769 A1  Mar. 23, 2017

(51) Int. Cl.
| | | |
|---|---|---|
| *C23F 1/16* | (2006.01) | |
| *B81C 1/00* | (2006.01) | |
| *H01L 21/033* | (2006.01) | |
| *B82Y 40/00* | (2011.01) | |

(52) U.S. Cl.
CPC ............ *C23F 1/16* (2013.01); *B81C 1/00476* (2013.01); *B82Y 40/00* (2013.01); *H01L 21/0331* (2013.01); *Y10S 148/10* (2013.01); *Y10S 977/856* (2013.01); *Y10S 977/857* (2013.01); *Y10S 977/893* (2013.01)

(58) Field of Classification Search
CPC ...... C23F 1/16; Y10S 148/10; Y10S 977/893; Y10S 977/856; Y10S 977/857; B81C 1/00476; H01L 21/0331; B82Y 40/00
See application file for complete search history.

(56) References Cited

U.S. PATENT DOCUMENTS

| | | | |
|---|---|---|---|
| 9,468,092 B2 * | 10/2016 | Sawada | C09D 105/16 |
| 2014/0284547 A1 * | 9/2014 | Dimitrakopoulos | |
| | | | H01L 29/0673 |
| | | | 257/9 |
| 2014/0377579 A1 * | 12/2014 | Ren | H01B 1/02 |
| | | | 428/605 |

\* cited by examiner

*Primary Examiner* — Anita K Alanko
(74) *Attorney, Agent, or Firm* — Spradley PLLC; Michael Spradley

(57) ABSTRACT

This disclosure teaches a method for producing a nano metal mesh. A brittle layer can be deposited onto a flexible substrate, the brittle layer having a thickness on the flexible substrate. The flexible substrate can be bent to produce a plurality of gaps on the brittle material. A material can be deposited at the surface of the flexible substrate filling the gaps of the brittle layer. Then, the brittle layer can be etched from the flexible substrate using an etchant, a nano metal mesh formed by the material previously in the gaps. The disclosure also teaches a nano metal mesh made using this method.

12 Claims, 9 Drawing Sheets

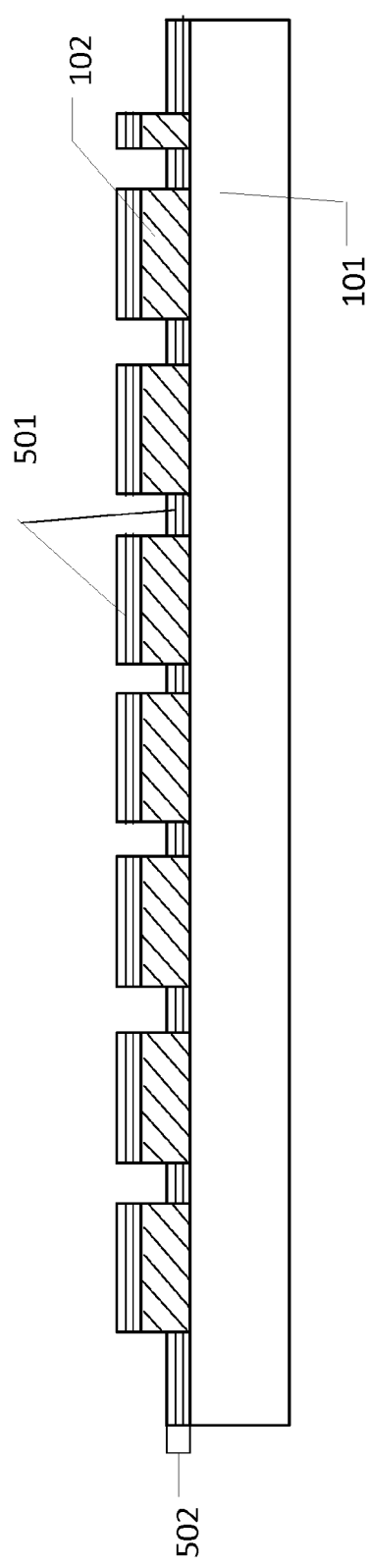

SYSTEM AND METHOD FOR PRODUCING A NANO METAL MESH USING A BRITTLE FILM TEMPLATE FOR LITHOGRAPHY

BACKGROUND

This disclosure relates to a system and method for producing a nano metal mesh using a brittle film template for lithography.

In the recent years, the growth of touch related devices and touch related applications made a huge impact in the development of transparent conductive film. Currently, the transparent conductive film market is dominated by Indium-tin-oxide (ITO) film. ITO film is widely known in the market because of its electrical conductivity, optical transparency, and ease of application when being used as a thin film. However, due to the limited supply of indium and expensive cost in production of ITO film, alternative transparent conductive films are continuously being developed. Some of the known alternatives are carbon nanotubes, graphene, and conductive polymers. However, these alternatives are still expensive, and cannot provide sufficient low resistance. The leading ITO alternative is nano metal mesh, which has the capability to provide high conductivity, and high optical transmission that is commercially competitive with ITO. Most nano metal mesh processes uses lithography, sintering, or other high defect methods. However, these methods are still costly especially when it involves high volume production. As such it would be useful to have an improved system and method for producing a nano metal mesh using a brittle film.

SUMMARY

This disclosure teaches a method for producing a nano metal mesh. A brittle layer can be deposited onto a flexible substrate, the brittle layer having a thickness on the flexible substrate. The flexible substrate can be bent to produce a plurality of gaps on the brittle material. A material can be deposited at the surface of the flexible substrate filling the gaps of the brittle layer. Then, the brittle layer can be etched from the flexible substrate using an etchant, a nano metal mesh formed by the material previously in the gaps. The disclosure also teaches a nano metal mesh made using this method.

BRIEF DESCRIPTION OF THE DRAWINGS

FIG. 5 illustrates a material deposited at the surface of a strip.

DETAILED DESCRIPTION

Described herein is a system and method for producing a nano metal mesh using a brittle film template for lithography. The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints), and that these goals will vary from one implementation to another. It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments, but are to be accorded their widest scope consistent with the principles and features disclosed herein.

Figure 1:
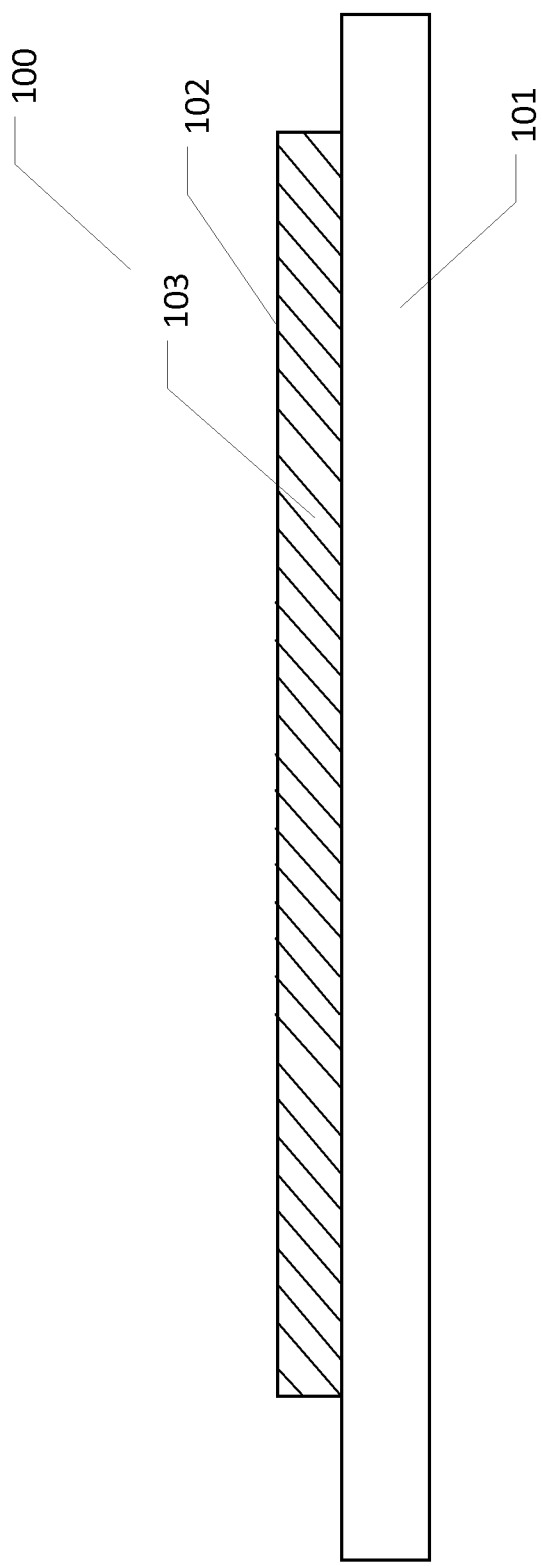
FIG. 1 illustrates a side view of a strip comprising a flexible substrate coated with a brittle film.

FIG. 1 illustrates a side view of a strip 100 comprising a flexible substrate 101 coated with a brittle film 102. In a preferred embodiment, flexible substrate 101 can be a bendable Optical grade Poly-ethylene Terephthalate (PET) film. In one example, PET film can be 75 um thick with a 25 um thick protective layer to prevent scratching and optical transmission defects during bending 10 cm wide. Brittle film 102 can comprise a brittle material 103, which can include but are not limited to salt, ceramic, or silica glass substance. An example of brittle film 102 is a spin-on-glass (SOG) liquid glass, which is a type of glass that can be applied as a liquid and cured to form a layer of glass having characteristics similar to those of SiO2.

The process of producing a nano mesh metal can initiate by depositing brittle material 103 to coat a surface of flexible substrate 101. Flexible substrate 101 can be coated through coating method that can include but is not limited to Mayer rod coating. In a preferred embodiment, a size #9 Mayer rod can be used to produce about 0.4 micron glass coating. After coating, brittle film 102 must be dry before proceeding to a bending process.

Figure 2:
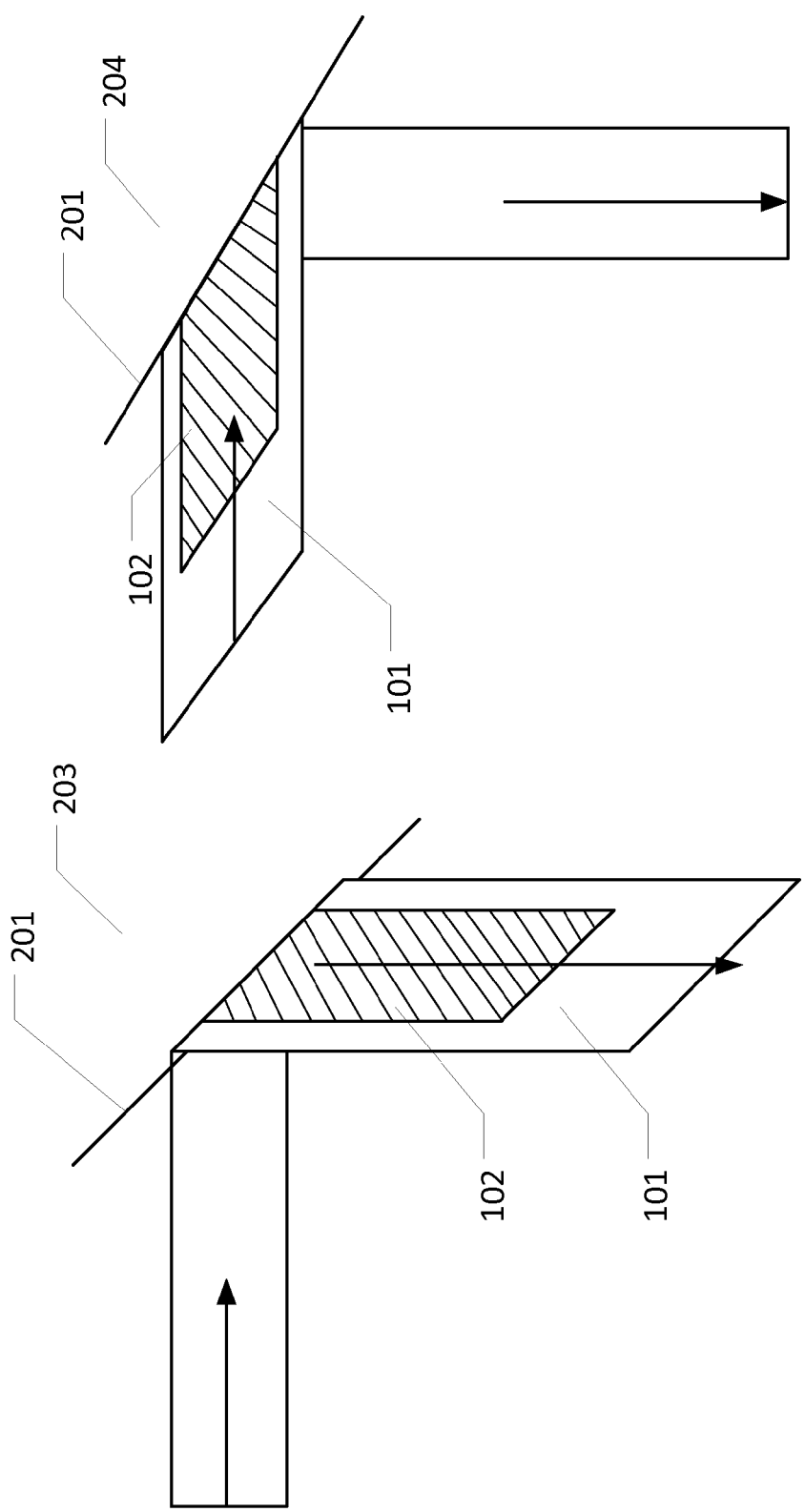
FIG. 2 illustrates the bending process of a strip using a turnbar.

FIG. 2 illustrates a bending process of strip 100, in one embodiment, using a turnbar 201. For large and upscale production, a roll-to-roll manufacturing operation using modified turnbars 201 (turnbars are commonly used to change direction of the roll to roll webs (PET)) as the bending bars can be used for perpendicular cracking of strip 100. Furthermore, the bending process can be done for crack propagation on brittle film 102. Strip 100 can be bent using a motor rewinder to pull it around turnbar 201. Strip 100 can be mounted on turnbar 201 at an angled position 202. In a preferred embodiment, angled position 202 is at a 45-degree angle. Angled position 202 of turnbar 201 can ensure that strip 100 remains at the same bending position, which can prevent horizontal movements on the turnbar plane. Moreover, turnbar 201 can be fixed and stationary to prevent movements on the turnbar plane. In a preferred embodiment, turnbar 201 can be a PTFE (Teflon) turnbar. PTFE (Teflon) turnbar is known to have a low coefficient of friction, which can minimize the chances of strip 100 from sticking to turnbar 201. Moreover, PTFE (Teflon) turnbar can provide uniform speed and a minimization of crack propagation defects.

In one embodiment, strip 100 can be bent using one turnbar 201 at a time. In this embodiment one end of strip 100 can be mounted on turnbar 201 at a first bend 203 and the other side of strip 100 mounted on the other side of turnbar 201 at a second bend 204. In another embodiment, strip 100 can be pulled through a pair of turnbars 201, to achieve perpendicular cracking. Further in one example, weight of first bend 203 can be 2.5 lbs. while weight of second bend 204 can be 4.5 lbs., the weight on first bend 203 and second bend 204 can produce tension in strip 100. In a preferred embodiment, first bend 203 can have a ⅝" diameter rod, while second bend 204 can have a 3/16" diameter rod. Such radiuses and the tension on turnbar 201 for first bend 203 and second bend 204 can produce a preferred template for a nano metal mesh.

Figure 3:
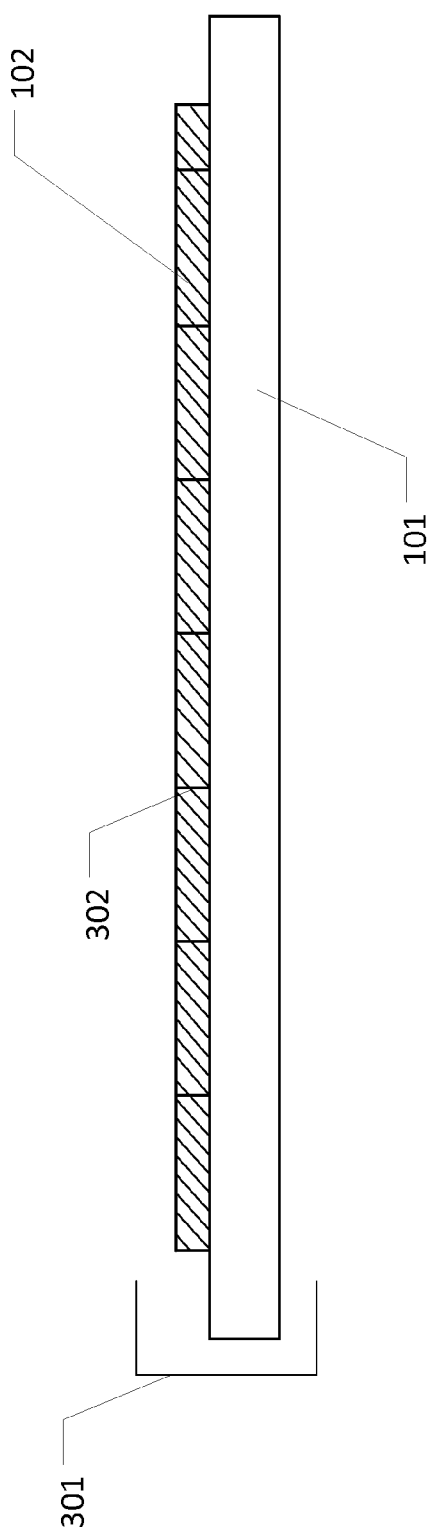
FIG. 3 illustrates a side view of a strip after the bending process.

FIG. 3 illustrates a side view of strip 100 after the bending process. The radius of turnbar 201, and tension applied on strip 100 for first bend 203 and second bend 204 are necessary to generate a sufficient nano-gap template 301. Nano-gap template 301 can be a preset format of nanoscale gap patterns made on brittle layer 102. Moreover, nano-gap template 301 is produced from the propagated cracks during the bending process. Nano-gap template 301 can comprise a plurality of nano-gaps 302. For purposes of this disclosure, a nano-gap 302 is a gap of 200 nanometers or less. In an embodiment wherein roll-to-roll manufacturing is used, strip 100 can be reduced in size through a slitting method. As an example, strip 100 can be cut into 10 cm×15 cm portions similar to the size of that of a conventional touchscreen smartphone.

Figure 4A:
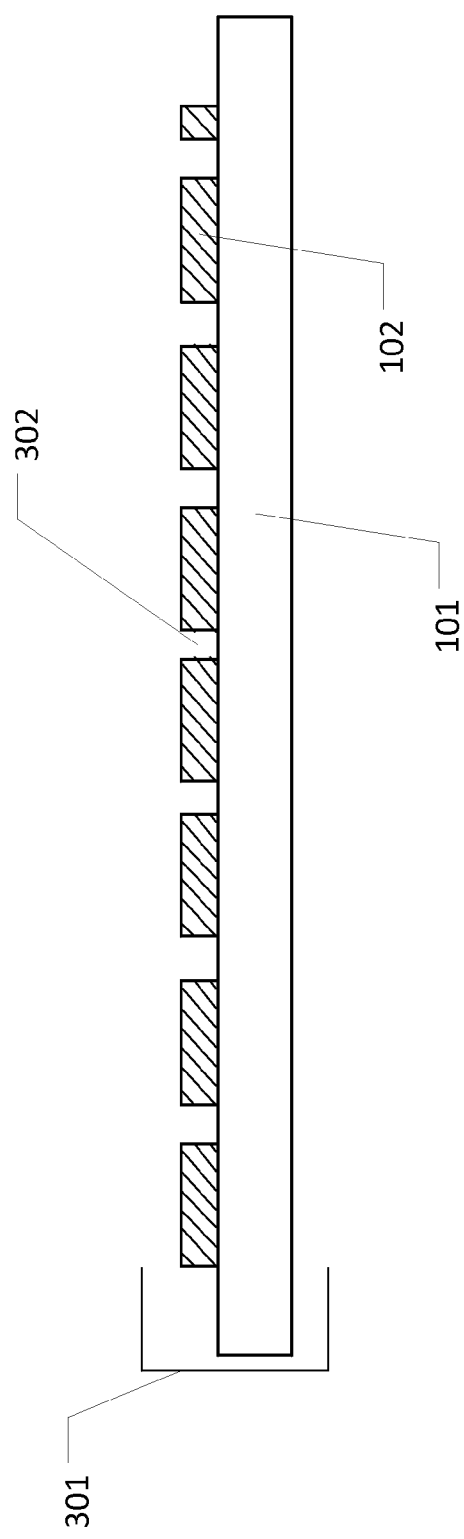
FIG. 4A illustrates a side view of a strip after heating.

FIG. 4A illustrates a side view of strip 100 after heating. In one embodiment, brittle film 102 can be heated for a period of time to widen nano-gaps 302 of up to, but not limited to, around 200 nanometers wide. The heating process can cause the solvent in brittle film 102 to evaporate drying and increasing the nanogap distance. In a preferred embodiment, brittle film 102 can be heated at 65 degrees Celsius for 15 seconds.

Figure 4B:
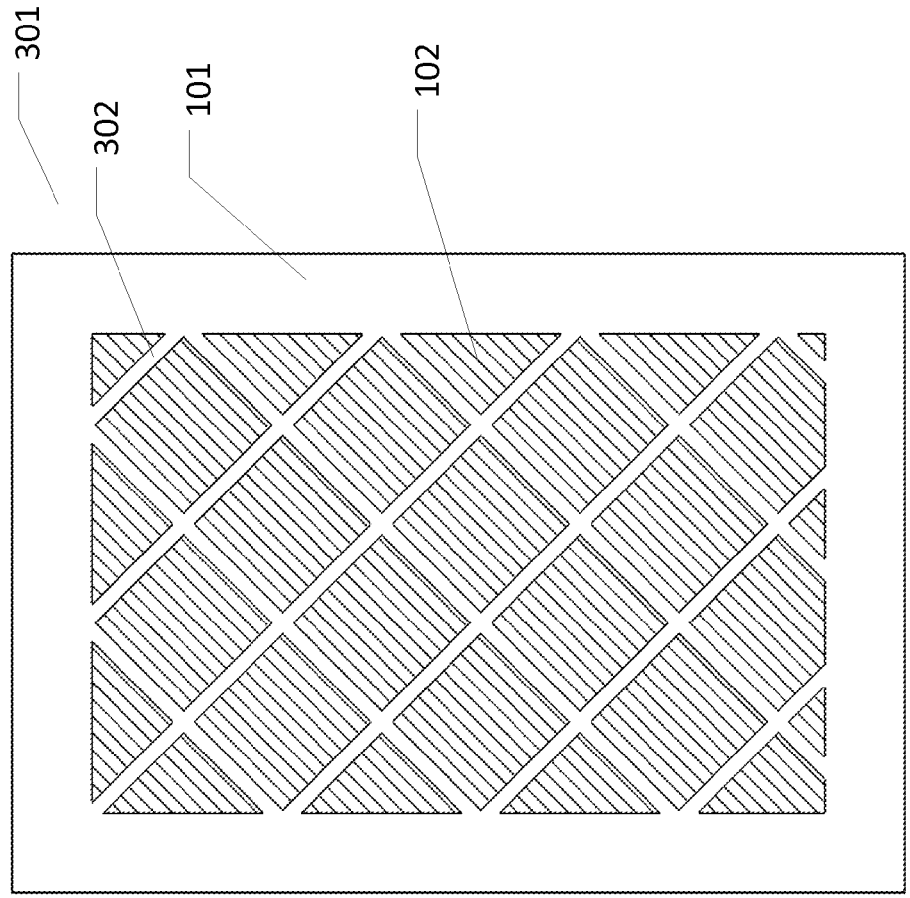
FIG. 4B illustrates a top view of a strip after heating.

FIG. 4B illustrates a top view of strip 100 after heating. In this embodiment, widened nano-gaps 302 can divide brittle film 102. The patterned structure of nano-gaps 302, which is formed at a surface of strip 100 creates a nano gap template 301 for nano metal mesh.

FIG. 5 illustrates a material 501 deposited at the surface of strip 100. In one embodiment, material 501 can include but is not limited to metals. In this embodiment, material 501 can be silver (Ag). Material 501 can have strong adherence to flexible substrate 101. This property can be essential to ensure that deposit material 501 can withstand the etching liftoff process of Nano mesh template 401. As shown in FIG. 5, material 501 can be evaporated onto the surface of strip 100 at a specific thickness 502, using an evaporator device such as an E-beam evaporator. This process can cover the surface of sections 301 and fill gaps 302 with material 501. In this embodiment, thickness 502 can be 1000 angstroms. Furthermore, after the deposition of material 501 if strip 100 is going to be stored for more than 10 minutes, brittle film 102 can be heated to prevent tarnishing of silver (Ag). The highest temperature applicable for heating after deposition can be 119 degrees Celsius just before the glass transition temperature. This is to ensure that flexible substrate 101 does not warp.

Figure 6:
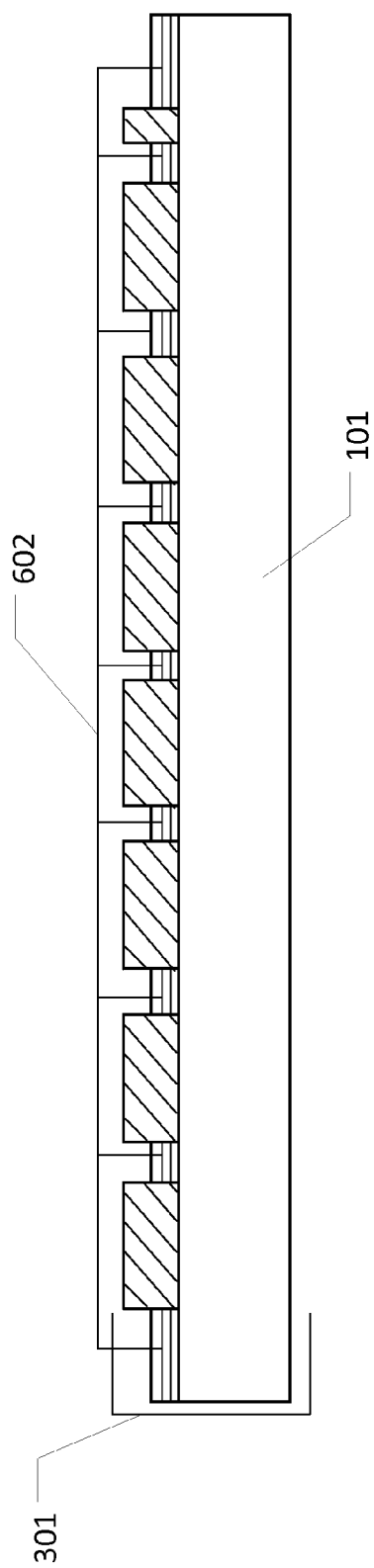
FIG. 6 illustrates a water solution deposited onto the surface of a strip.

FIG. 6 illustrates a water solution 601 deposited onto the surface of strip 100. Water solution 601 can be deposited onto the surface of brittle film 102. In a preferred embodiment, water solution 601 can be a Sodium Chloride (NaCl) water solution. This NaCl stripping method, can liftoff or strip material 501 that was placed onto the surface of brittle film 102. Furthermore, this process can leave a silver (Ag) mesh 602 intact with nano mesh template 301.

Figure 7A:
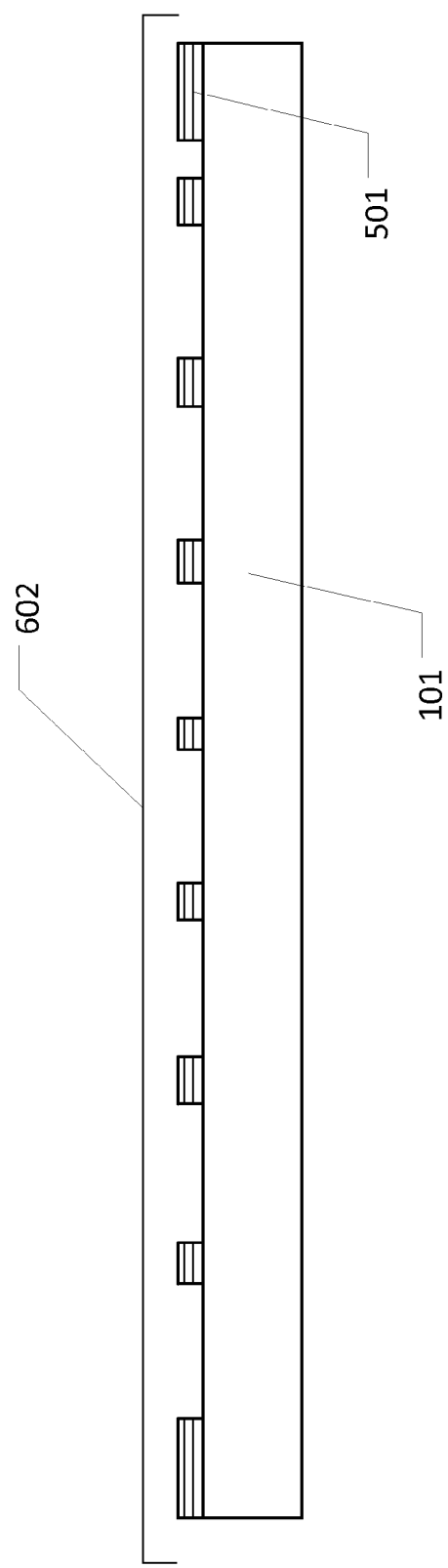
FIG. 7A illustrates a side view of a strip after the etching process.

FIG. 7A illustrates a side view of PET strip 100 after the etching process. After the NaCl stripping process, an etching process can be performed on brittle film 102 using an etchant 701. Etchant 701 can include but is not limited to water or various acids. In this embodiment, etchant 701 can be a Hydrofluoric (HF) acid solution. Brittle material 103 that is within nano-gaps 302 can be etched from strip 100, which can expose or leave Ag mesh 602 intact with flexible substrate 101. The result of etching process can then produce a nano metal mesh 700. For purposes of this disclosure, NaCl water solution can be used as water solution 601 so that Silver (Ag) material 501 can be recycled without having to filter Ag out of HF acid solution, which can be dangerous and costly.

Figure 7B:
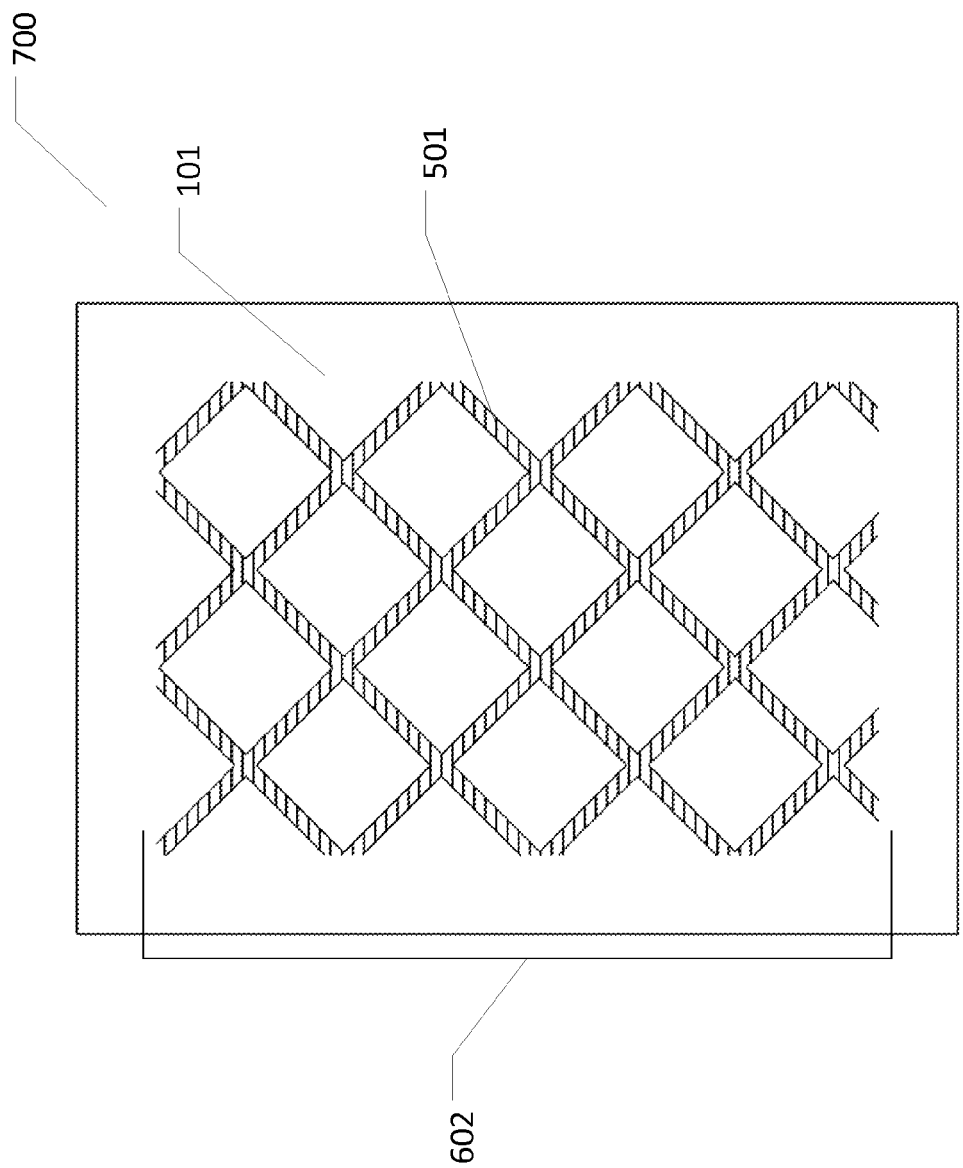
FIG. 7B illustrates a top view of a nano metal mesh.

FIG. 7B illustrates a top view of nano metal mesh 700. Nano metal mesh 700 can comprise of Ag mesh 602 attached to the surface of flexible substrate 101. Further for purposes of this disclosure, results may vary according to the different bending radius, tension, after bend heat, and thickness of metal applied.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A method for producing a nano metal mesh comprising the steps of
   depositing a brittle layer onto a flexible substrate, said brittle layer having a thickness on said flexible substrate;
   bending said flexible substrate to produce a plurality of gaps on said brittle material;
   depositing a material at the surface of said flexible substrate filling said gaps of said brittle layer;
   etching said brittle layer from said flexible substrate using an etchant, a nano metal mesh formed by said material previously in said gaps.

2. The method of claim 1, further comprising the steps of
   drying said brittle layer on said flexible substrate prior to bending said flexible substrate; and
   mounting said flexible substrate on said turnbar after drying said brittle layer.

3. The method of claim 1, wherein bending said flexible substrate is performed using one or more turnbars.

4. The method of claim 1, wherein after deposition of said material further comprises the step of heating said flexible substrate to prevent tarnishing said material from tarnishing.

5. The method of claim 1 wherein said flexible substrate is a bendable Optical grade Poly-ethylene Terephthalate (PET) film.

6. The method of claim 1 wherein said brittle layer comprises a Spin On Glass (SOG) liquid glass.

7. The method of claim 1 wherein said thickness is about 0.4 microns.

8. The method of claim 1 wherein said flexible substrate is bent around said turnbar at an angle of approximately 45 degrees.

9. The method of claim 1 wherein said flexible substrate is pulled around a first bend with around 2.5 lbs tension and said flexible substrate is pulled around a second bend with around 4.5 lbs tension.

10. The method of claim 1 wherein said material is Silver (Ag).

11. The method of claim 1 wherein said water solution is a Sodium Chloride (NaCl) water solution.

12. The method of claim 1 wherein said etchant is a hydrofluoric (HF) acid solution.

\* \* \* \* \*